(12) United States Patent
Huang et al.

(10) Patent No.: US 6,576,560 B1
(45) Date of Patent: Jun. 10, 2003

(54) METHOD FOR AVOIDING THE FLUORINATION OF THE METAL CONTACT OF THE SEMICONDUCTOR DEVICE

(75) Inventors: Wan-Ken Huang, Hsin-Chu (TW); Chu-Kuang Tsai, Hsin-Chu (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 10/062,661

(22) Filed: Feb. 5, 2002

(51) Int. Cl.$^7$ ............................................. H01L 21/302
(52) U.S. Cl. ...................... 438/710; 438/711; 438/612
(58) Field of Search ................... 438/710, 711, 438/612, 589, 706; 257/531, 693

(56) References Cited

U.S. PATENT DOCUMENTS

| | | | |
|---|---|---|---|
| 5,592,007 A | * | 1/1997 | Leedy .......................... 257/347 |
| 6,020,257 A | * | 2/2000 | Leedy .......................... 438/626 |
| 6,063,699 A | * | 5/2000 | Hanafi et al. ................ 438/589 |
| 6,165,898 A | * | 12/2000 | Jang et al. .................... 438/638 |
| 6,249,039 B1 | * | 6/2001 | Harvey et al. ................ 257/531 |
| 6,255,727 B1 | * | 7/2001 | Khoury ........................ 257/693 |
| 6,297,164 B1 | * | 10/2001 | Khoury et al. ............... 438/708 |
| 6,376,384 B1 | * | 4/2002 | Yen et al. ..................... 438/706 |
| 6,392,232 B1 | * | 5/2002 | Gooch et al. ................. 250/332 |
| 6,413,857 B1 | * | 7/2002 | Subramanian et al. ....... 438/638 |
| 6,436,802 B1 | * | 8/2002 | Khoury ........................ 438/612 |

\* cited by examiner

*Primary Examiner*—John F. Niebling
*Assistant Examiner*—Olivia Luk

(57) ABSTRACT

First of all, a semiconductor substrate having a metal contact thereon is provided. Then a protecting layer is formed on the semiconductor substrate and the metal contact. Afterward, an etching process is performed to etch through the protecting layer until exposing a partial surface of the metal contact, so as to form and define a predetermined opening in the protecting layer, wherein an etching-reactive layer is formed on the protecting layer after finishing the plasma etching process. Finally, a stripping process is performed to remove the etching-reactive layer on the protecting layer and form a contact window and a metal contact thereof without fluoride, whereby it is avoided reacting the etching remainder with the metal pad during the follow-up process.

28 Claims, 6 Drawing Sheets

METHOD FOR AVOIDING THE FLUORINATION OF THE METAL CONTACT OF THE SEMICONDUCTOR DEVICE

BACKGROUND OF THE INVENTION

1. Field of the Invention

The present invention relates generally to a process for manufacturing the metal contact of semiconductor device, and more particularly to avoid the fluorination of the metal contact.

2. Description of the Prior Art

As electrical components are made smaller, various strategies have been adopted to reduce the amount of space devoted to connections between the chip containing the integrated circuit devices and the printed circuit board on which the chips are mounted. Electrical connections between integrated circuits on a chip and the printed circuit board are made through bonding pads typically provided at the periphery of the chip. Conventional bonding pad structures may include a bonding metal layer and a barrier metal layer deposited over an underlying dielectric layer such as a silicon oxide layer. The bonding metal layer is in electrical contact with one or more semiconductor devices in the chip. The barrier metal layer on the underlying dielectric layer helps adhere the bonding metal layer, typically aluminum, to the underlying dielectric layer.

Connections between the bonding pads of a chip and the leads printed on the circuit board have conventionally been provided through the lead frame used as part of lead frame packaging methods. In such lead frame packaging methods, the chip is mounted to a frame that incorporates an array of electrical leads, with thin bonding wires connecting the bonding pads to the electrical leads on the lead frame. The entire chip and lead frame assembly is encapsulated in plastic and then mounted on the printed circuit board through the leads extending from the package. Another packaging method that is called the chip-on-board method, and the semiconductor chip is mounted directly to the printed circuit board, have significant space and weight advantages over conventional lead frame packaging methods. Electrical connections between the bonding pads of the chip and the circuit board on which the chip is mounted are typically provided by wire bonding thin wires between the chips bonding pads and the leads printed on the board. The wire bonds may be formed using a variety of techniques including ultrasonic bonding and thermocompression bonding. Ultrasonic bonding uses ultrasonic waves or vibration to attach the wire to the bonding pad. Thermocompression bonding uses a combination of elevated temperature and compressive force to attach the wire to the bonding pad. Both of these bonding techniques impart mechanical and/or thermal energy directly to the bonding pad area and so can damage the bonding pad and the chip. Furthermore, in the conventional process, the protecting layer is fluorinated to form a fluoride layer on the protecting layer after performing the plasma process with fluoride, it will result in the decrease of stress in the metal pad that will produce many defects during follow-up process. For example, it reduces electrical contact between the bonding pad and the integrated circuit devices on the chip, which decreases the reliability and reduces the life of the chip. In light of the multi-inter layers, the metal contact can be fluoridized during the process for forming the contact window or the via hole above the metal layer.

In accordance with the above description, a new and improved method for forming the metal contact of the semiconductor device is therefore necessary, so as to raise the yield and quality of the follow-up process.

SUMMARY OF THE INVENTION

In accordance with the present invention, a new method for forming the bounding pad or the metal contact is provided that substantially overcomes drawbacks of above mentioned problems arised from the conventional methods.

Accordingly, it is an object of the present invention to provide a new method for forming the metal contact of the semiconductor device, the present invention applies an ashing process with oxygen, so as to avoid fluoridizing the metal layer. Furthermore, a large fluoride content on the protecting layer can be stripped by the way of using the method in the present invention, so as to prevent the bonding pad from being fluoridized with the remained fluoride in the follow-up process. So, this invention can effectively raise the quality and the yield of the process.

In accordance with the present invention, a new method for avoiding fluoridization of metal contact in the semiconductor device is disclosed. First of all, a semiconductor substrate having a metal contact thereon is provided. Then a protecting layer is formed on the semiconductor substrate and the metal contact. Afterward, an etching process is performed to etch through the protecting layer until exposing a partial surface of the metal contact, so as to form and define a predetermined opening in the protecting layer, wherein an etching-reactive layer is formed on the protecting layer after finishing the plasma etching process. Finally, a stripping process is performed to remove the etching-reactive layer on the protecting layer and form a contact window and a metal contact thereof without fluoride, whereby it is avoided reacting the etching remainder with the metal pad during the follow-up process.

BRIEF DESCRIPTION OF THE DRAWINGS

The foregoing aspects. and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Preferred embodiments of the present invention will now be described in greater detail. Nevertheless, it should be recognized that the present invention can be practiced in a wide range of other embodiments besides those explicitly described, and the scope of the present invention is expressly not limited except as specified in the accompanying claims.

Figure 1A:
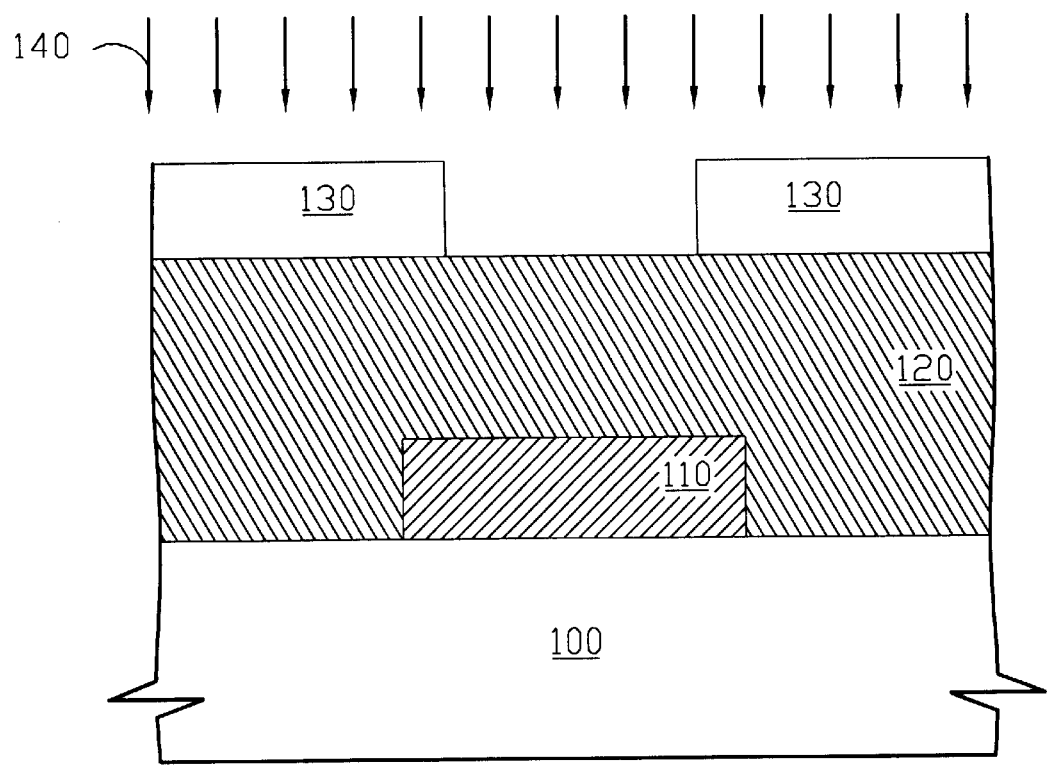
FIGS. 1A and 1B show cross-sectional views illustrative of various stages of the method for forming the contact window of the semiconductor device in accordance with the first embodiment of the present invention.
Figure 1B:
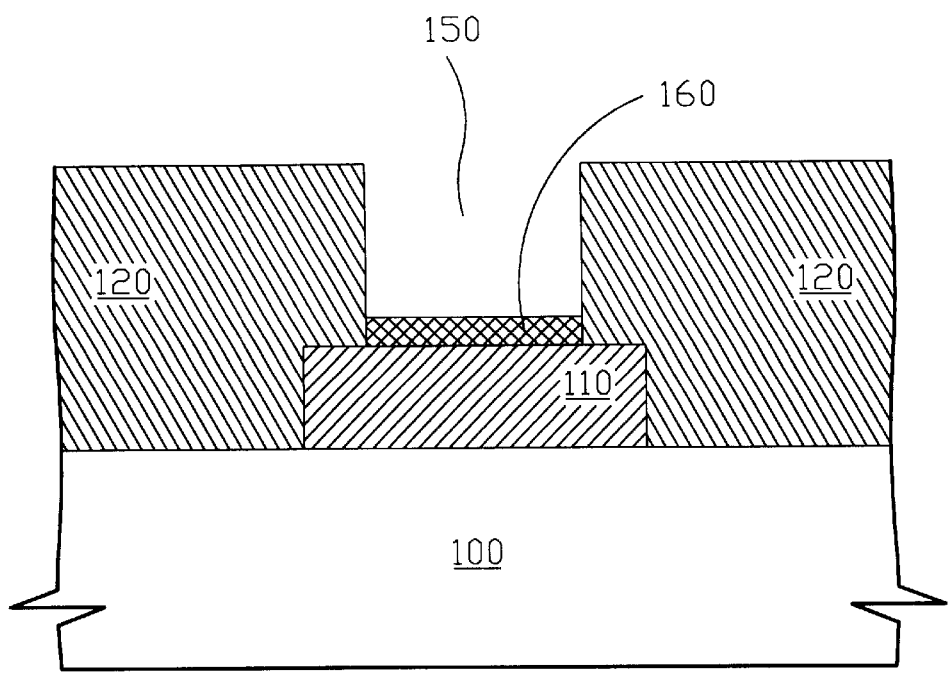
Figure 2A:
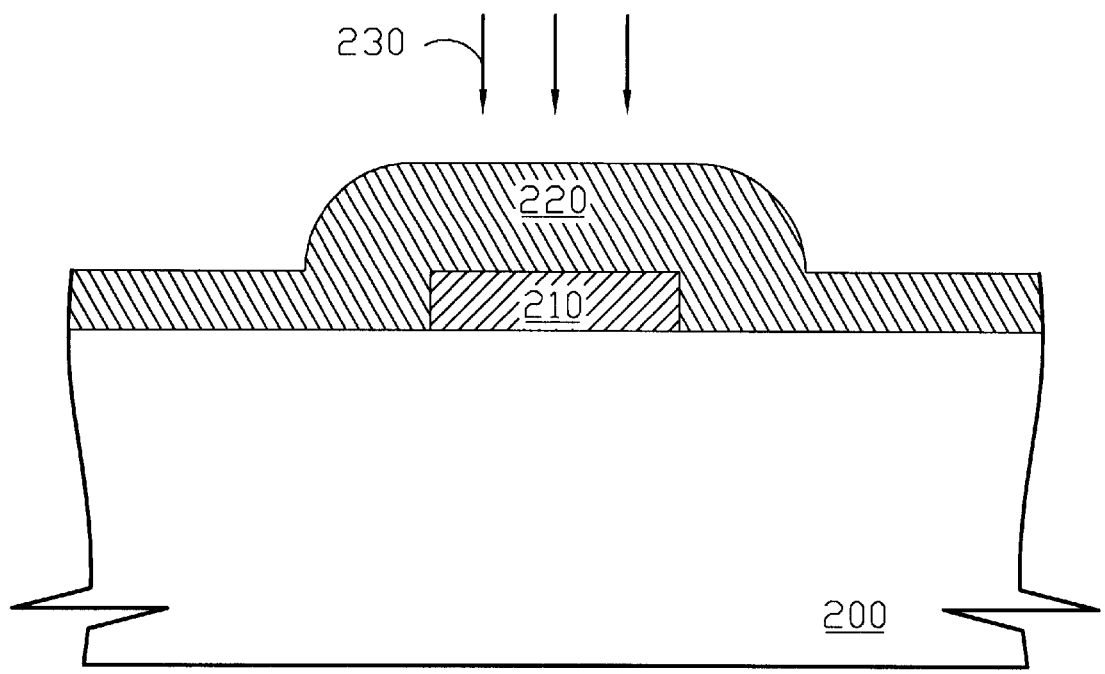
FIGS. 2A to 2D show cross-sectional views illustrative of various stages of the method for forming the bonding pad of the semiconductor device in accordance with the first embodiment of the present invention.
Figure 2B:
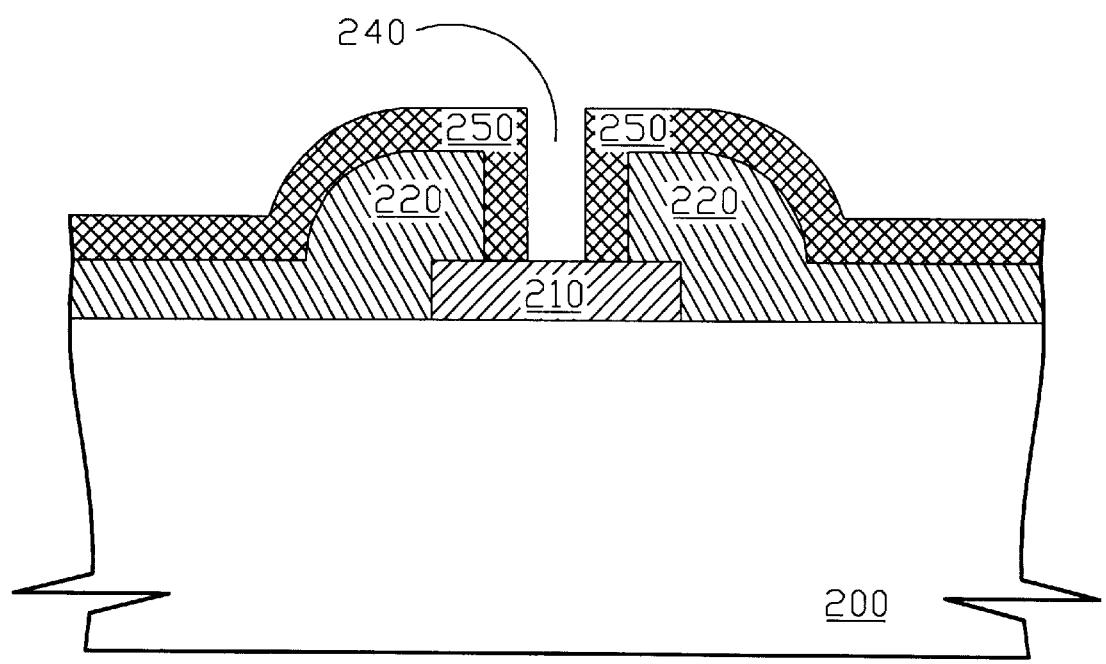
Figure 2C:
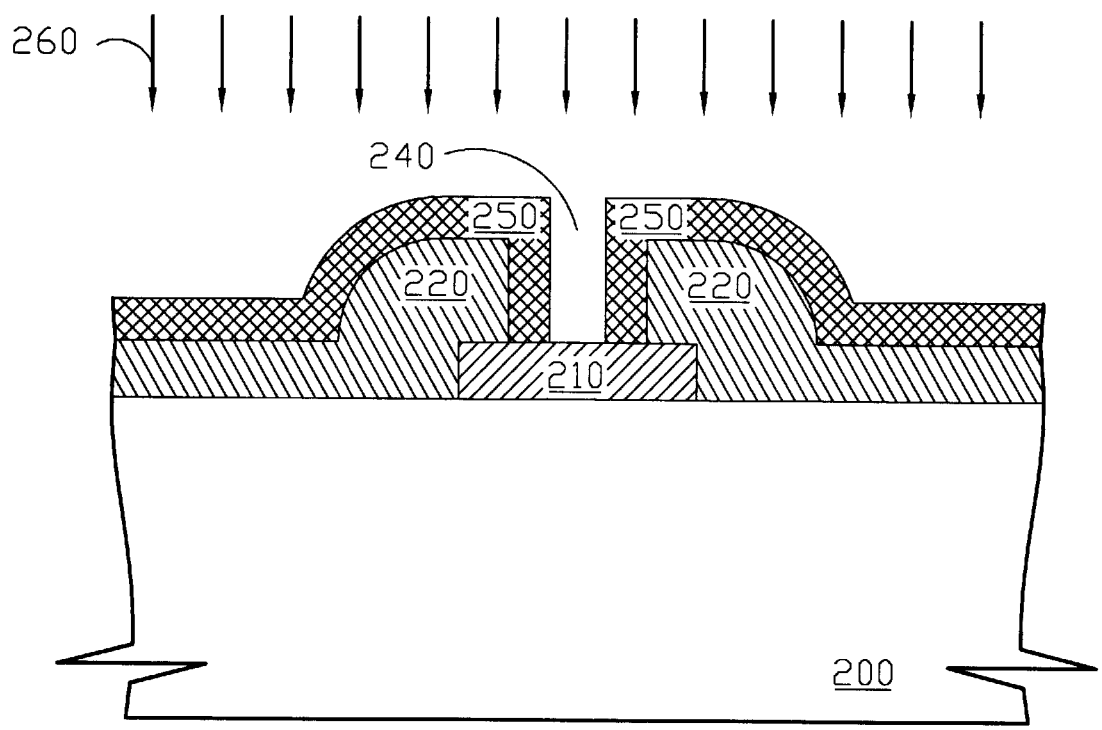
Figure 2D:
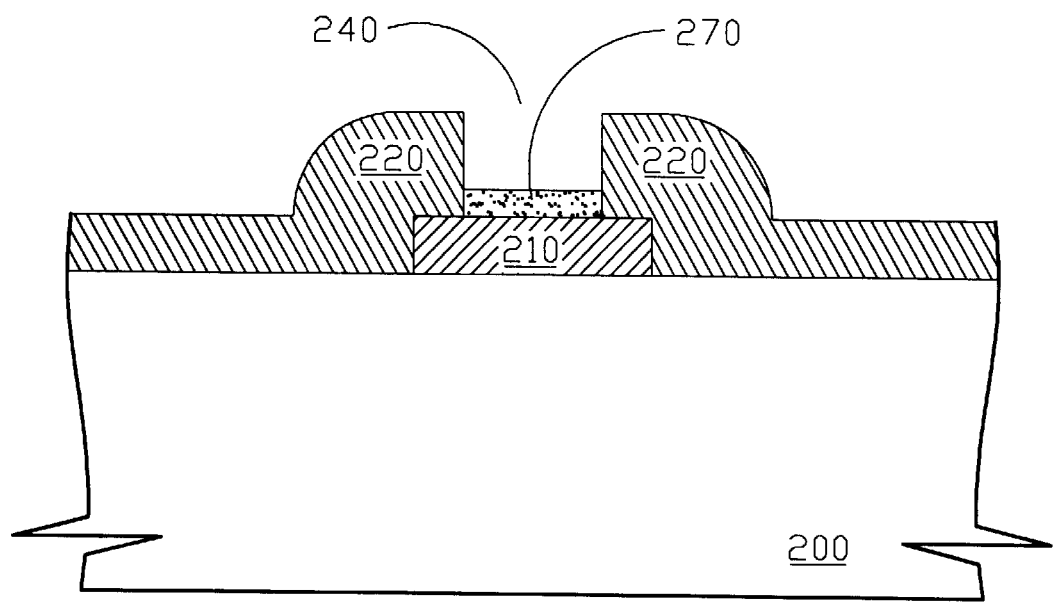
Figure 3A:
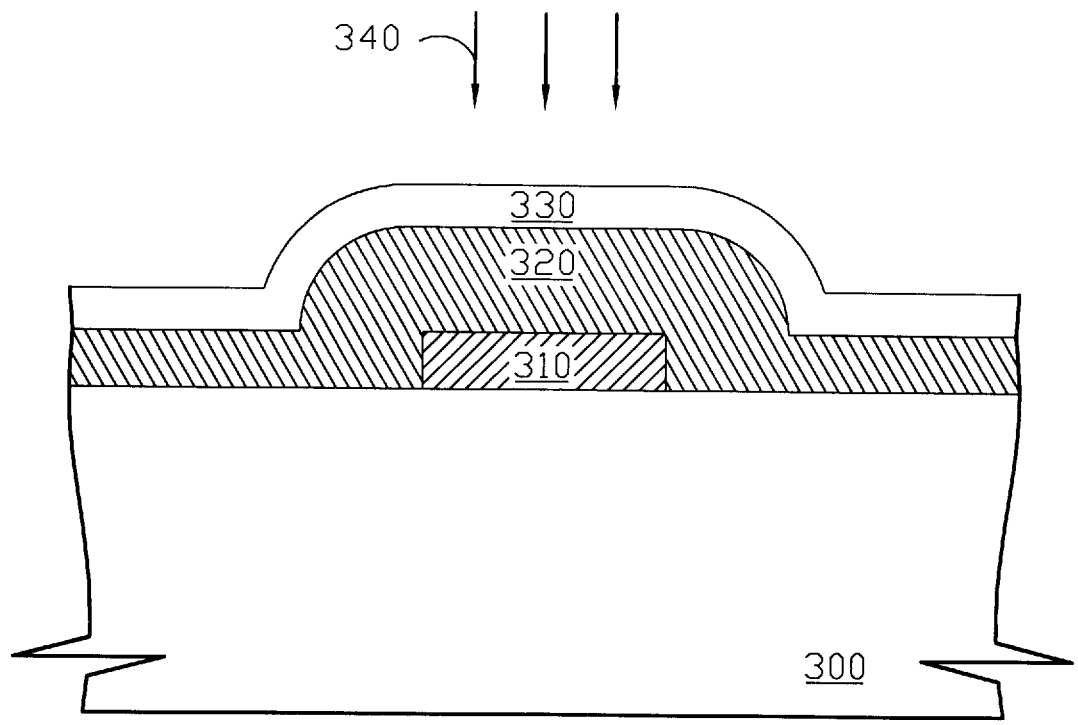
FIGS. 3A to 3D show cross-sectional views illustrative of various stages of the method for forming the bonding pad of the semiconductor device by way of using the ashing process in accordance with the second embodiment of the present invention.
Figure 3B:
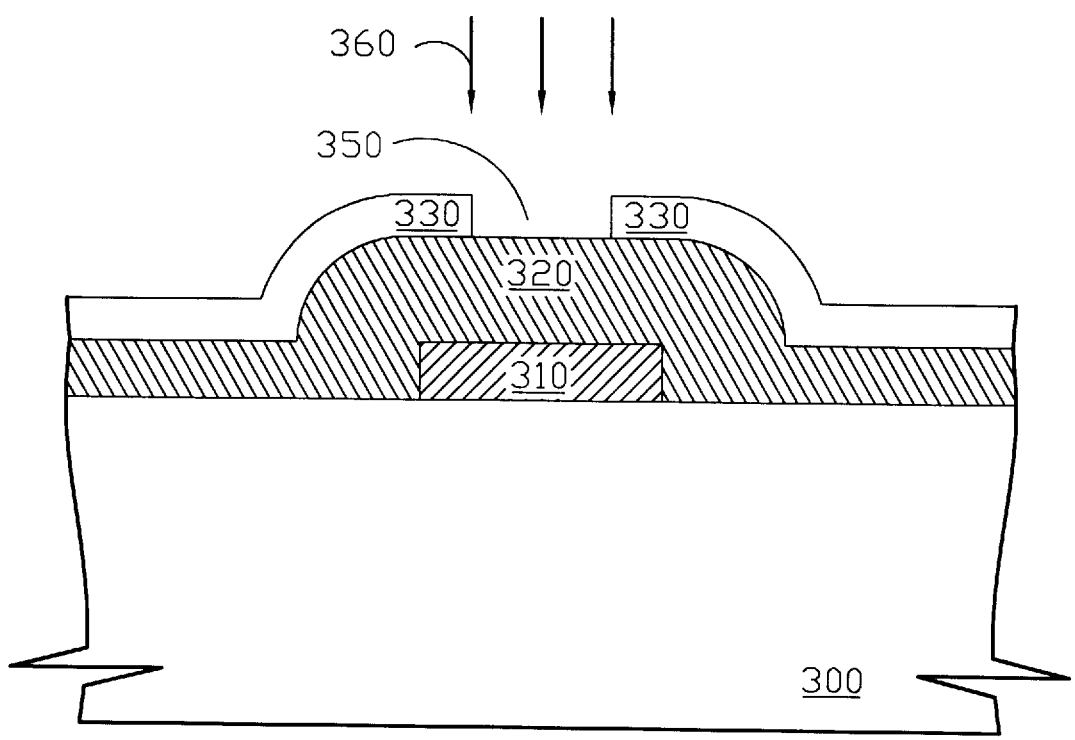
Figure 3C:
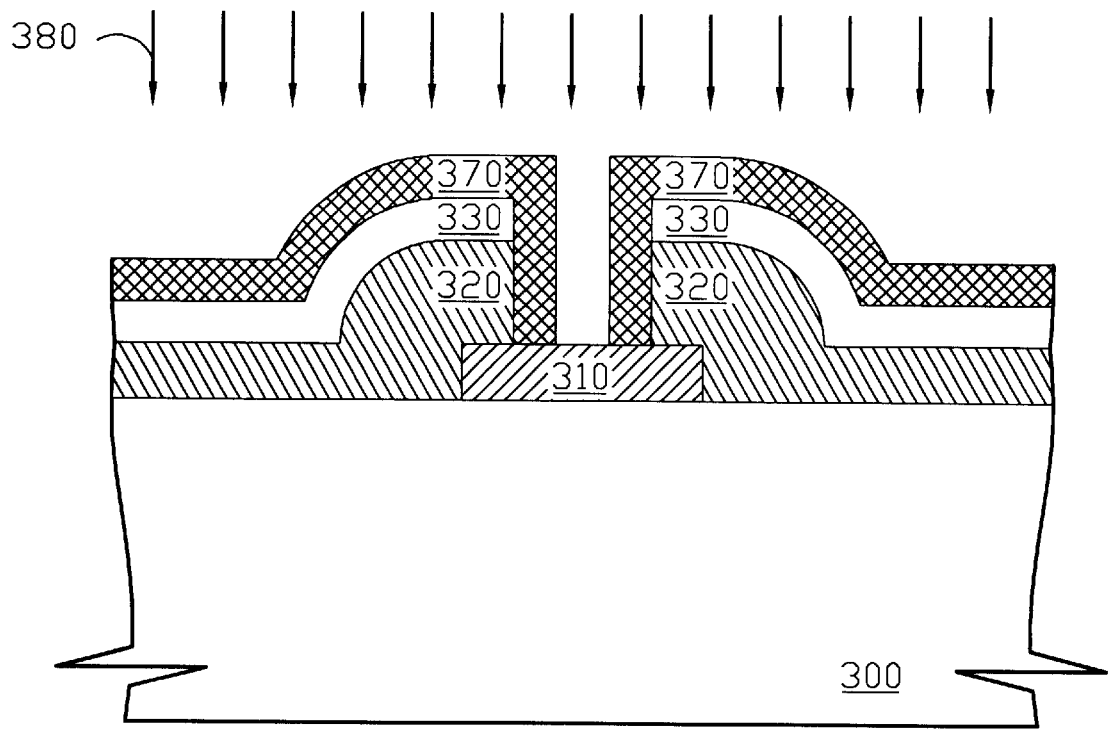
Figure 3D:
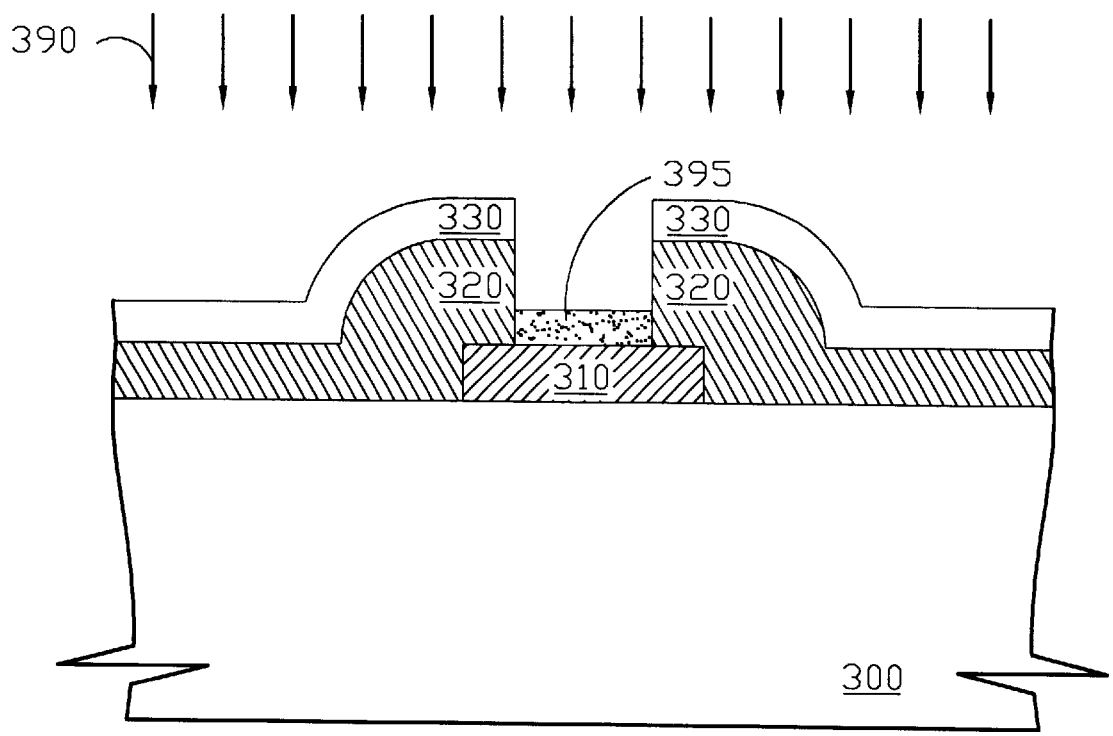

As illustrated in FIG. 1A and FIG. 1B, in the first embodiment of the present invention, first of all, a semiconductor substrate 100 having a metal contact 110 is provided, and those are covered with a dielectric layer 120 thereon. Afterward, a photoresist layer is defined and formed on the dielectric layer 120 to perform an etching process 140, such as plasma etching process with fluoride, so as to etch through the dielectric layer 120 until exposing a partial surface of the metal contact 110 and form a contact window 150 (or a via hole) in the dielectric layer 120, wherein the etching process 140 comprises an oxygen whose content is about less than 10% content of the sum of the whole gases. Furthermore, a protecting layer 160 with oxide is formed on the metal contact 110 after finishing the etching process 140, and then the photoresist layer 130 is removed. Therefore, this invention can avoid producing the reactant on the entire semiconductor structure during the etching process 140.

As illustrated in FIG. 2A to FIG. 2D, in the second embodiment of the present invention, first of all, a semiconductor substrate 200 having a metal contact 210 thereon is provided, wherein the metal contact 210 comprises a material of aluminum. Then a first protecting layer 220 is formed on the semiconductor substrate 200 and the metal contact 210, wherein the first protecting layer 220 comprises a polyimide (PI) and a passivation layer, such as dielectric layer. Afterward, an etching process 230 is performed to etch through the protecting layer 220 until exposing a partial surface of the metal contact 210, so as to form and define a predetermined opening 240 in the first protecting layer 220, wherein an etching-reactive layer 250 is conformed on the first protecting layer 220 after finishing the etching process 230, and further, the etching process 230 comprises a plasma etching process, such as plasma etching process with fluoride-based, and the etching-reactive layer 250 comprises a fluoride layer. Finally, a stripping process 260, such as ashing process, is performed to remove the etching-reactive layer 250 on the first protecting layer 220, wherein the gas source of the stripping process 260 comprises a mixed gases with oxygen and nitrogen, its mixed ratio comprises a proportion of 100/1900 (oxygen/nitrogen), and the oxygen is about 5% content of the sum of the whole mixed gases. Furthermore, a second protecting layer 270, such as oxide layer, is conformed on the metal contact 210 after finishing the removing process 260. Therefore, this invention can avoid reacting the etching-reactive layer 250 on the entire semiconductor structure with the metal contact 210 in the follow-up processes.

As illustrated in FIG. 3A to FIG. 3E, in the third embodiment of the present invention, first of all, a semiconductor substrate 300 is provided. Then a metal pad 310 is formed and defined on the semiconductor substrate 300, wherein the metal pad 310 comprises a material of aluminum. Next, a dielectric layer 320 is deposited on the semiconductor substrate 300 and the metal pad 310, wherein the dielectric layer 320 comprises oxide or nitride. Afterward, a polyimide layer 330 is conformed on the dielectric layer 320, wherein the method for forming the polyimide layer 330 comprises a coating process. A photolithography process 340 is then performed to etch through the polyimide layer 330, so as to form and define a predetermined opening 350. Subsequently, a plasma etching process 360 is performed by way of the predetermined opening 350 to etch through the dielectric layer 320 until exposing a partial surface of the metal pad 310, wherein an etching-reactive layer 370 is formed on the polyimide layer 330 after finishing the plasma etching process 360, and there are polymer reminder is remained in the entire structure; and further, the plasma etching process 360 comprises a plasma etching process with fluoride-based, and the etching-reactive layer 370 comprises a fluoride layer. Finally, a wet etching process 380 is performed to remove the polymer reminder in all structure, and then an ashing process 390 is performed to remove the etching-reactive layer 370 on the polyimide layer 330 and form a bonding pad, wherein the ashing process 390 comprises an ashing process with oxygen, and the gas source of the ashing process 390 comprises a mixed gases with oxygen and nitrogen, its mixed ratio comprises a proportion of 100/1900 (oxygen/nitrogen), and the oxygen is about 5% content of the sum of the whole mixed gases. According the present invention avoid reacting the etching remainder with the metal pad 310 during the follow-up process.

Figure 4:
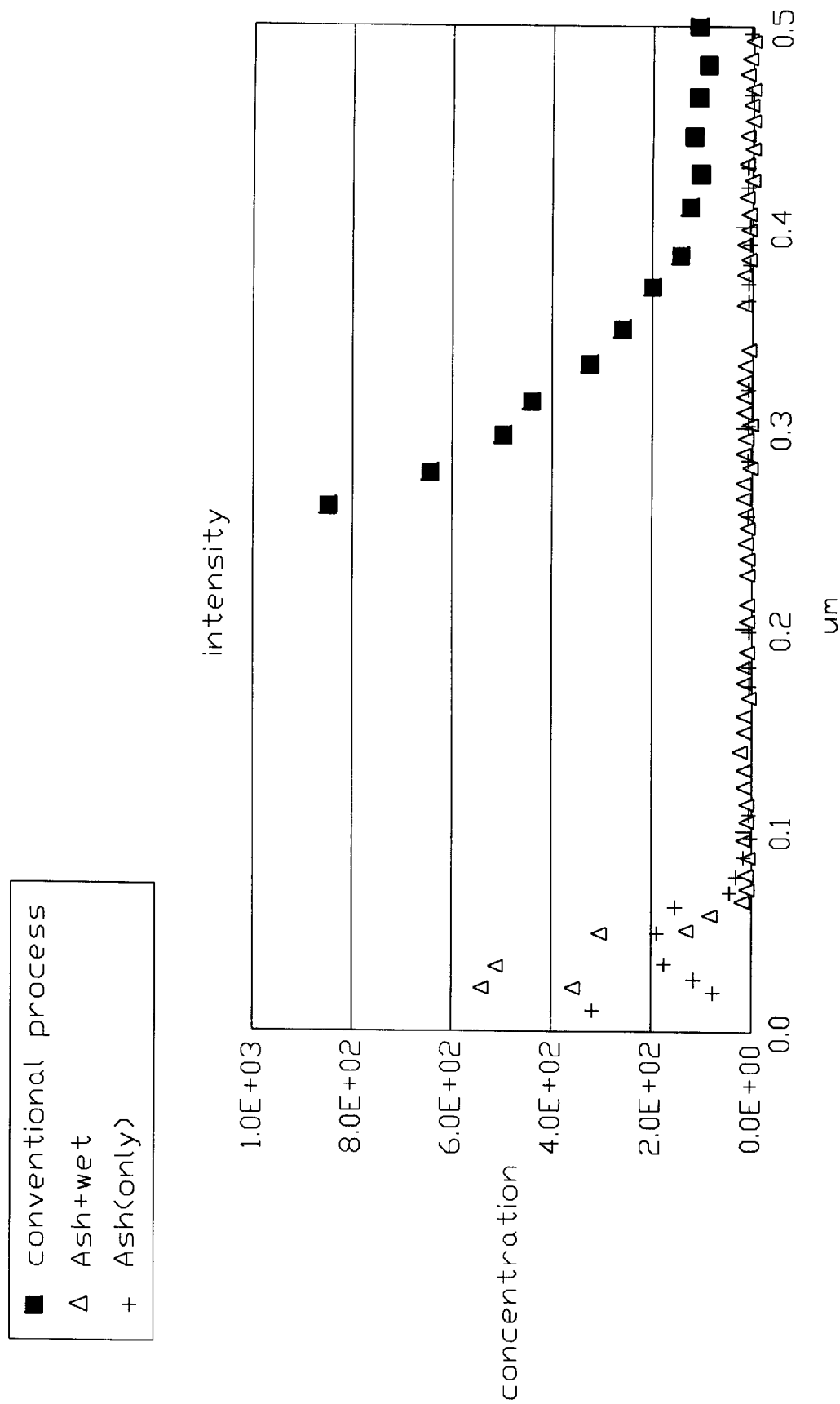
FIG. 4 shows the chart of the experimental data in accordance with the present invention and the prior art.

In these embodiments of the present invention, the present invention can utilize an ashing process with oxygen to avoid fluoridizing the protecting layer. Furthermore, a large fluoride content on the protecting layer can be stripped by the way of using the method in the present invention, so as to prevent the metal contact from being fluoridized with the remained fluoride in the follow-up process. Referring to the FIG. 4, it shows the fluoride remainder content, obviously, the method of the present invention less than the prior art. So, this invention can effectively raise the quality and the yield of the process. Therefore, this invention corresponds to economic effect and utilization in industry, and it is appropriate for deep sub-micron technology.

Of course, it is possible to apply the present invention to perform the process for forming the metal contact of the semiconductor device, and to any process for forming the contact window or the via hole of the semiconductor devices. Also, the ashing process of the present invention can be applied to fully strip the fluoride remainder and strengthen structure concerning the method used for forming the bonding pad structure has not been developed at present. The method of the present invention is the best process for forming metal contact of the semiconductor device.

Obviously, many modifications and variations of the present invention are possible in light of the above teachings. It is therefore to be understand that within the scope of the appended claims, the present invention may be practiced otherwise than as specifically described herein.

Although specific embodiments have been illustrated and described, it will be obvious to those skilled in the art that various modifications may be made without departing from what is intended to be limited solely by the appended claims.

What is claimed is:

1. A method for forming a bonding pad of the semiconductor device, the method comprising:

providing a semiconductor substrate having a metal contact thereon;

forming a first protecting layer on said semiconductor substrate and said metal contact;

performing an etching process to etch through said first protecting layer until exposing a partial surface of said metal contact, so as to form and define a predetermined opening in said first protecting layer, wherein an etching-reactive layer is conformed on said first protecting layer after finishing said etching process; and performing a stripping process to remove said etching-reactive layer on said first protecting layer and conform a second protecting layer on said metal contact, so as to form said bonding pad.

2. The method according to claim 1, wherein said metal contact comprises an aluminum material.

3. The method according to claim 1, wherein said protecting layer comprises a material of polyimide.

4. The method according to claim 1, wherein said protecting layer comprises a passivation layer.

5. The method according to claim 1, wherein said etching process comprises a plasma etching process.

6. The method according to claim 5, wherein said plasma etching process comprises a plasma etching process, and said plasma etching process uses the fluoride-based gas.

7. The method according to claim 1, wherein said etching-reactive layer comprises a fluoride layer.

8. The method according to claim 1, wherein said stripping process comprises an ashing process.

9. The method according to claim 8, wherein said ashing process comprises a mixed gas with oxygen and nitrogen.

10. The method according to claim 9, wherein said mixed gas comprises a mixed ratio of oxygen/nitrogen is about 100/1900.

11. The method according to claim 9, wherein said oxygen is about 5% content of said mixed gas.

12. The method according to claim 1, wherein said second protecting layer is an oxide layer.

13. The method according to claim 4, wherein passivation layer comprises a dielectric layer.

14. The method according to claim 1, wherein the method comprises a step for forming a polyimide layer on said passivation layer before performing said etching process.

15. The method according to claim 14, wherein said polyimide layer is etched by said etching process etches to form said predetermined opening before etching said passivation layer.

16. The method according to claim 15, wherein said etching-reactive layer is conformed on said polyimide layer.

17. The method according to claim 15, wherein a polymer remainder remains after finishing said etching process.

18. The method according to claim 17, wherein said polymer remainder is removed before removing said etching-reactive layer.

19. The method according to claim 18, wherein the step for removing said polymer remainder comprises a wet etching process.

20. A method for forming a bonding pad of the semiconductor device, the method comprising:

providing a semiconductor substrate having a metal contact with aluminum material thereon;

forming a first protecting layer on said semiconductor substrate and said metal contact;

performing a plasma etching process with fluoride to etch through said first protecting layer until exposing a partial surface of said metal contact, so as to form and define a predetermined opening in said first protecting layer, wherein an etching-reactive layer having fluoride is conformed on said first protecting layer after finishing said etching process; and performing a stripping process to remove said etching-reactive layer on said first protecting layer and conform a second protecting layer with oxide on said metal contact, so as to form said bonding pad.

21. The method according to claim 20, wherein said protecting layer comprises a material of polymide.

22. The method according to claim 20, wherein said protecting layer comprises a passivation layer with dielectric material.

23. The method according to claim 20, wherein said stripping process comprises an ashing process.

24. The method according to claim 23, wherein said ashing process comprises a mixed gas with oxygen an nitrogen, and said mixed gas has a mixed ratio of oxygen/nitrogen is about 100/1900.

25. The method according to claim 24, wherein said oxygen is about 5% content of said mixed gas.

26. The method according to claim 20, wherein the method comprises a step for forming a polyimide layer on said passivation layer before performing said etching process; and further, said polyimide layer is etched by said etching process etches to form said predetermined opening before etching said passivation layer and said etching-reactive layer is conformed on said polyimide layer.

27. The method according to claim 26, wherein a polymer remainder is remained said whole structure before removing said etching-reactive layer and after finishing said etching process.

28. The method according to claim 27, wherein the step for removing said polymer remainder comprises a wet etching process.

* * * * *